United States Patent [19]

Price, Jr. et al.

[11] Patent Number: 5,257,146
[45] Date of Patent: Oct. 26, 1993

[54] MAGNETIC HEAD SWING CLAMP AND CROSS-TALK ELIMINATOR FOR READ/WRITE PREAMPLIFIER

[75] Inventors: John J. Price, Jr., Edina; Craig M. Brannon, Golden Valley, both of Minn.

[73] Assignee: VTC Inc., Bloomington, Minn.

[21] Appl. No.: 879,554

[22] Filed: May 4, 1992

Related U.S. Application Data

[63] Continuation of Ser. No. 545,272, Jun. 28, 1990, abandoned.

[51] Int. Cl.⁵ .............................................. G11B 5/02
[52] U.S. Cl. ..................................................... 360/67
[58] Field of Search ................................ 360/46, 67, 68

[56] References Cited

U.S. PATENT DOCUMENTS

| | | | |
|---|---|---|---|
| 3,581,110 | 5/1971 | Belcastro | 307/273 |
| 4,249,219 | 2/1981 | Aoi et al. | 360/46 |
| 4,523,238 | 6/1985 | Keel et al. | 360/46 |

Primary Examiner—John Shepperd
Assistant Examiner—Won Tae C. Kim
Attorney, Agent, or Firm—Kinney & Lange

[57] ABSTRACT

A magnetic head swing clamp configured for interconnection with a read/write preamplifier of the type including a read differential transistor pair connected to an inductive head. The collectors of the transistors in the read differential transistor pair provide first and second read output signals at first and second read output terminals for connection to a read amplifier. The magnetic head swing clamp comprises a reference voltage generator which produces first and second reference voltage levels at first and second reference voltage output terminals. Positive and negative voltage clamps are electrically connected to the first and second reference voltage output terminals, respectively, and to the first and second read output terminals. The positive and negative voltage clamps clamp voltage swings in the first and second read output signals as functions of the first and second reference voltage levels. The clamping action prevents emitter-base break down of the read differential transistor pair and cross-talk between parallel-connected read/write preamplifiers during write mode operations.

21 Claims, 4 Drawing Sheets

MAGNETIC HEAD SWING CLAMP AND CROSS-TALK ELIMINATOR FOR READ/WRITE PREAMPLIFIER

This is a continuation of application Ser.No. 07/545,272 filed on Jun. 28, 1990, abandoned as of the date of this application.

BACKGROUND OF THE INVENTION

The present invention relates to a magnetic head read/write preamplifier within a magnetic storage system. In particular, the present invention relates to a magnetic head swing clamp and cross-talk eliminator configured for interconnection with the read/write preamplifier.

A magnetic storage system includes a magnetic head that reads and writes information on a recording surface of a magnetic media, such as a magnetic disk. The magnetic head includes an inductive coil which reads and writes the information by sensing or creating a changing magnetic field. A read/write preamplifier is connected to the magnetic head at first and second head contacts. The preamplifier includes read circuitry and write circuitry for controlling the read and write operations.

The read/write preamplifier may be operated in either a read mode or a write mode. During read mode operation, the read circuitry monitors differential voltages at the head contacts created by current induced in the inductive coil by the changing magnetic field on the recording surface of the disk. The read circuitry includes first and second read data output terminals that supply read data output signals which are representative of the information stored on the disk.

During write mode operation, the write circuitry forces a relatively large write current through the inductive coil to create a magnetic field that polarizes bit positions on the recording surface. Digital information is stored by reversing the polarization of selected bit positions by reversing the direction of the current flow in the inductive coil.

In one typical storage system, the read circuitry includes a read differential transistor pair formed by first and second NPN-type transistors. The base terminals of the read pair are connected to the first and second head contacts, respectively. The emitters of the read pair are connected together at a read current sink. The collectors of the read pair form the first and second read data output terminals. The read data output signals at the first and second read data output terminals are applied to a read amplifier.

The write circuitry includes an H-switch write control circuit connected across the inductive coil at the first and second head contacts. The H-switch includes an upper write transistor pair and a lower write transistor pair that have control terminals which are operated by write data signals. The H-switch directs the write current through the inductive coil in either a first direction or a second direction, opposite to the first direction, as a function of the write data signals.

The read/write preamplifier configuration described above is well known in the art and is commonly used within magnetic storage systems. However, several problems arise with this configuration. First, fairly large voltage swings are generated at the head contacts during write mode operation for switching the direction of current flow quickly in the inductive coil. Because current in an inductor cannot change instantaneously, the voltage swings have a tendency to momentarily rise above their forcing voltage causing a voltage spike.

Such a condition can produce voltages across the connected read differential transistor pair which exceed the breakdown voltages of the transistors and degrade or otherwise damage the transistors. For example, if the first head contact rises greatly positive such that the voltage across the read pair is greater than the base-emitter voltage drop of the first transistor in the pair plus the emitter-base breakdown voltage of the second transistor in the pair, the second transistor in the pair may break down and degrade.

One common solution to the breakdown problem involves slowing down the H-switch such that voltage spikes do not occur. The base voltages of the connected read differential transistor pair are adequately controlled to prevent breakdown. This solution, however, limits the rate at which data may be written to the magnetic disk.

Another common solution to the breakdown problem includes the addition of diodes connected in series with the emitters of the read differential transistor pair. The diodes significantly increase the voltage at which the transistors will break down. This solution results in increased noise in the read data output signals.

The second problem that arises with the described read/write preamplifier configuration is cross-talk from one magnetic head to another. In larger storage systems, a plurality of read/write preamplifier circuits are connected together in parallel. The individual preamplifier circuits are commonly known as head cell circuits. There is one head cell circuit for each magnetic head in the storage system. Because only one head cell circuit and associated head are selected at a given time, cross-talk between a selected head and an unselected head is undesirable.

The read data output terminals of each head cell circuit are connected together at the read amplifier. Therefore, all of the read differential transistor pair collectors are connected together in parallel. Each transistor in the read pairs includes a parasitic capacitance across its collector-base junction. Large and rapid voltage transients at the head contacts in the selected head cell charge and discharge the read pair collector-base junction capacitance causing large currents at the read data output terminals. These currents can cause capacitive coupling between the collector-base junction at the selected head and the collector-base junctions at the unselected heads. As a result, the capacitive coupling may generate large currents through unselected magnetic heads, thereby writing through the read pairs of the unselected heads and corrupting data stored on the magnetic disk.

One common solution to the cross-talk problem includes connecting the collectors of the parallel read differential transistor pairs together through individual cascode transistors, thus reducing the capacitive coupling between the magnetic heads. This solution requires a large number of transistors which increases expense.

It is evident that there is a continuing need for improved solutions to both the read differential transistor pair breakdown problem and the cross-talk problem in magnetic storage systems.

SUMMARY OF THE INVENTION

The present invention is a magnetic head swing clamp configured for interconnection with a read/write preamplifier of the type having first and second read output terminals. The magnetic head swing clamp includes a reference voltage generator which produces a first reference voltage level at a first reference voltage output terminal. A positive voltage clamp is electrically connected to the first reference voltage output terminal and to the first and second read output terminals for clamping positive voltage swings in the first and second read output signals as a function of the first reference voltage level.

The read/write preamplifiers with which the present invention may be used typically include write current switching circuits and read differential transistor pairs connected to inductive magnetic heads. The preamplifiers are responsive to mode signals which drive the preamplifiers between read modes and write modes and between selected and unselected states. The collectors of the transistors in the read differential transistor pairs provide first and second read output signals at the first and second read output terminals for connection to a read amplifier. The positive voltage clamp prevents large voltage swings across each of the magnetic heads from breaking down and degrading the connected read differential transistor pairs.

In one embodiment, the magnetic head swing clamp is configured for interconnection with a plurality of read/write preamplifiers connected in parallel. The first and second read output terminals of the read/write preamplifiers are connected in parallel with one another for connection to the read amplifier. This configuration, however, can produce cross-talk during write mode operation between the read differential transistor pairs which creates large currents in unselected magnetic heads.

In one embodiment, the magnetic head swing clamp eliminates cross-talk by clamping both positive and negative voltage swings at the first and second read output terminals. In this embodiment, the reference voltage generator produces a second reference voltage level at a second reference voltage output terminal. A negative voltage clamp is electrically connected to the second reference voltage output terminal and to the first and second read output terminals for clamping negative voltage swings in the first and second read output signals as a function of the second reference voltage level.

The positive and negative voltage clamps are driven between active and inactive states as a function of the first and second reference voltage levels, respectively. The reference voltage generator includes mode input terminals connected to the mode signals for driving the generator between the read mode operation and the write mode operation as a function of the mode signals. The first reference voltage level drives the positive voltage clamp into the active state during write mode operation and into the inactive state during read mode operation. The second reference voltage level drives the negative voltage clamp into the active state during write mode operation and into the inactive state during read mode operation.

The positive voltage clamp includes first and second transistors and a relatively negative voltage supply rail. The first transistor includes first and second terminals which form a primary current flow path connected in series between the first read output terminal and the relatively negative voltage supply rail. The first transistor further includes a control terminal connected to the first reference voltage output terminal. The second transistor includes first and second terminals which form a primary current flow path connected in series between the second read output terminal and the relatively negative voltage supply rail. The second transistor further includes a control terminal connected to the first reference voltage output terminal.

The negative voltage clamp includes first and second transistors and a relatively positive voltage supply rail. The first transistor includes first and second terminals which form a primary current flow path connected in series between the first read output terminal and the relatively positive voltage supply rail. The first transistor further includes a control terminal connected to the second reference voltage output terminal. The second transistor includes first and second terminals which form a primary current flow path connected in series between the second read output terminal and the relatively positive voltage supply rail. The second transistor further includes a control terminal connected to the second reference voltage output terminal.

DETAILED DESCRIPTION OF THE PREFERRED EMBODIMENTS

Figure 1:
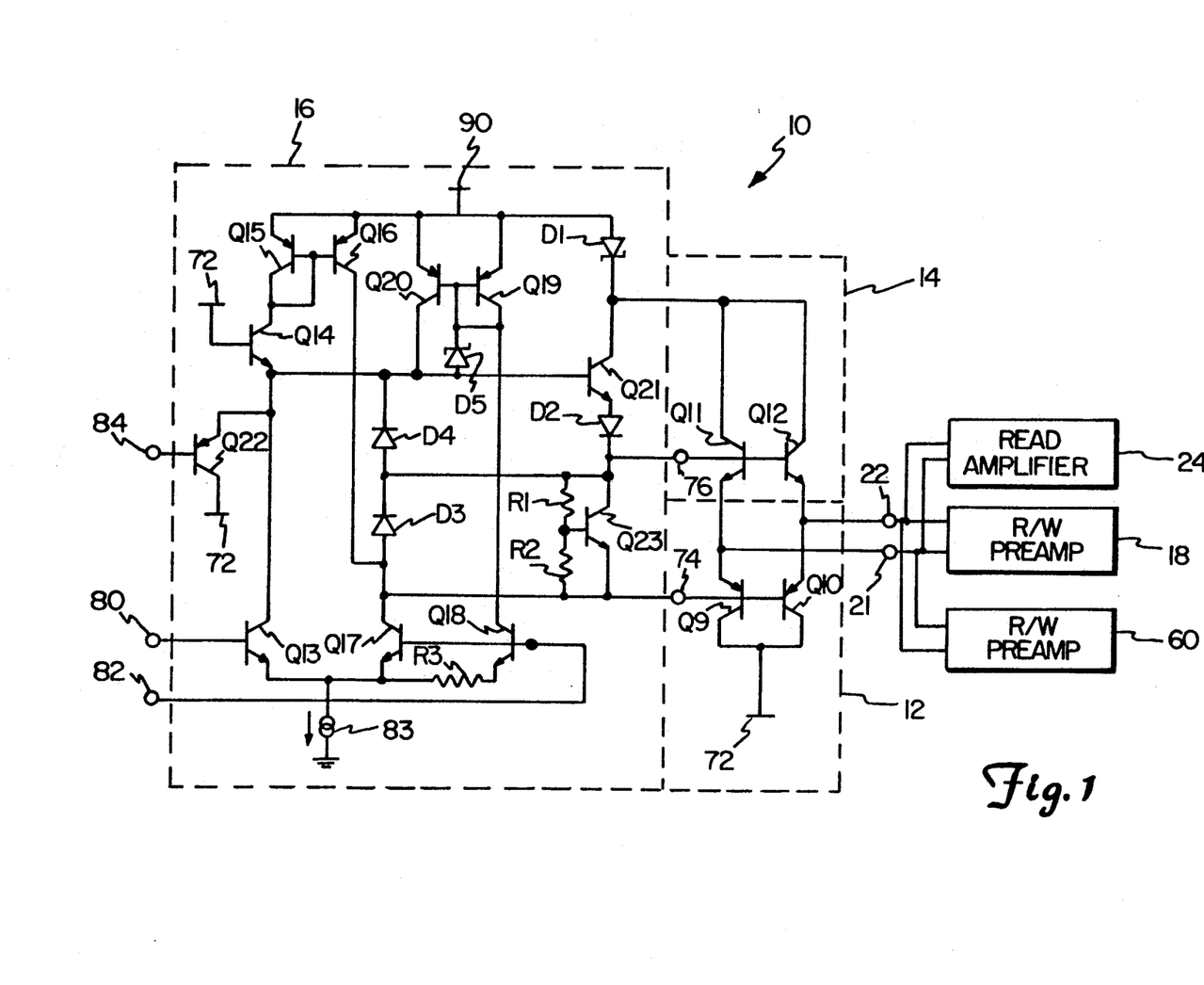
FIG. 1 is a schematic illustration of a magnetic head swing clamp in accordance with the present invention.

The magnetic head swing clamp of the present invention is illustrated in FIG. 1. Magnetic head swing clamp 10 includes positive voltage clamp 12, negative voltage clamp 14 and reference voltage generator 16. Magnetic head swing clamp 10 is configured for interconnection with read/write preamplifier 18 at read output terminals 21 and 22. Read/write preamplifier 18 sends read data output signals to read amplifier 24 through read output terminals 21 and 22. Read/write preamplifier 18 includes read circuitry and write circuitry connected to an inductive magnetic head. During operation of preamplifier 18 in the write mode, positive voltage clamp 12 clamps positive voltage swings at read output terminals 21 and 22 as a function of a first reference voltage level to prevent large voltage swings across the magnetic head from damaging the read circuitry within preamplifier 18. Negative voltage clamp 14 clamps negative voltage swings at the read output terminals as a function of a second reference voltage level.

In large magnetic storage systems, several read/write preamplifiers such as 18 may be connected together in parallel to read amplifier 24. Only one magnetic head is selected at a time. Large voltage swings across the selected magnetic head during write mode operation causes capacitive coupling between the read circuitry of the parallel-connected read/write preamplifiers. The capacitive coupling may cause cross-talk between the magnetic heads. Positive and negative voltage clamps 12 and 14 clamp positive and negative voltage swings in the read data output signals to prevent capacitive coupling and cross-talk between parallel-connected preamplifiers during write mode operation. This prevents writing through the preamplifier read circuitry of an unselected head through capacitive coupling.

To facilitate a better understanding of the present invention, the following discussion will first address the operation of read/write preamplifier 18 and its associated problems. The magnetic head swing clamp of the present invention will then be discussed in greater detail.

Figure 2:
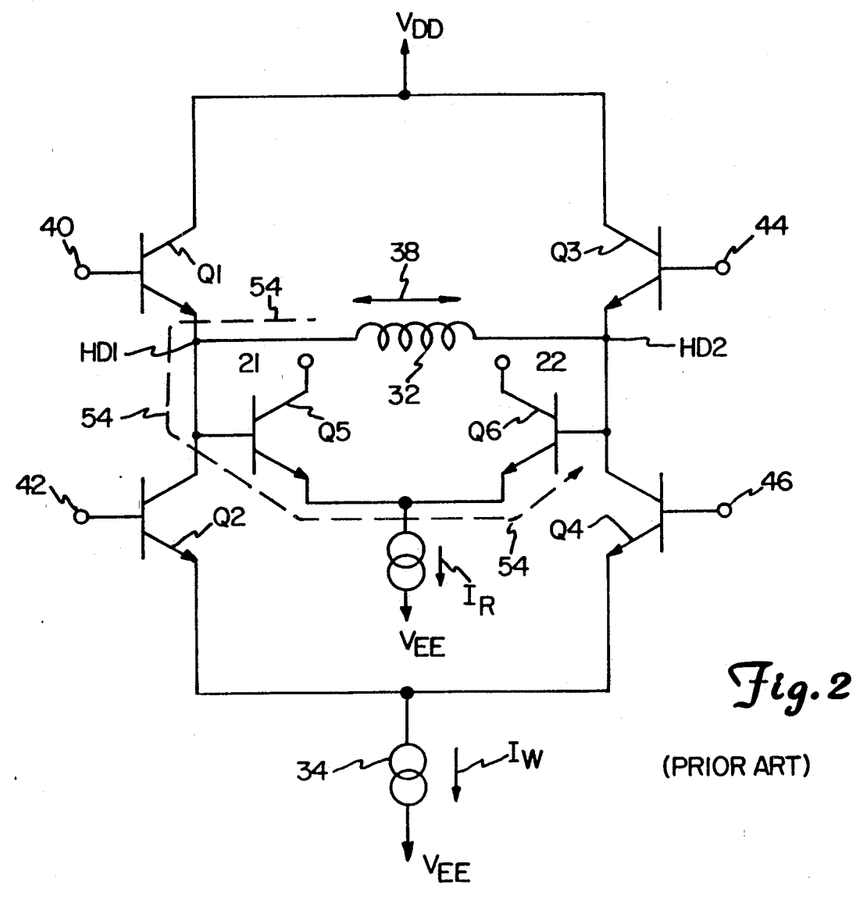
FIG. 2 is a schematic illustration of a prior art read/write preamplifier connected to a magnetic head.

FIG. 2 is a schematic illustration of read/write preamplifier 18 connected to magnetic head 32. Read/write preamplifier 18 includes write circuitry and read circuitry connected to magnetic head 32. The write circuitry is formed by transistors Q1, Q2, Q3 and Q4 and write current sink 34. The read circuitry is formed by transistors Q5 and Q6 and read current sink 36. Read/write preamplifier 18 may be operated in either a read mode or a write mode, as a function of mode signals applied to read current sink 34 and write current sink 36. The mode signals drive current sinks 34 and 36 between active and inactive states.

Transistors Q1, Q2, Q3 and Q4 form a typical H-switch that controls the direction of current flow (indicated by arrows 38) in magnetic head 32 as a function of write data signals received at terminals 40, 42, 44 and 46. The H-switch is connected between voltage supply rail $V_{DD}$ and write current sink 34. Write current sink 34 is connected between the H-switch voltage supply rail $V_{EE}$. Write current sink 34 sinks a write current $I_W$ through magnetic head 32.

Transistors Q5 and Q6 of the read circuitry are connected as a read differential transistor pair. The base terminals of transistors Q5 and Q6 are connected to head contacts HD1 and HD2, respectively. The emitters of transistors Q5 and Q6 are connected together at read current sink 36. Read current sink 36 sinks a read current $I_R$ that is directed through transistors Q5 and Q6, as a function of differential voltages induced across magnetic head 32 at head contacts HD1 and HD2. The collectors of transistors Q5 and Q6 provide read data output signals at read output terminals 21 and 22 for connection to read amplifier 24 (shown in FIG. 1). Read output terminals 21 and 22 are also connected to positive and negative voltage clamps 12 and 14.

The read/write preamplifier configuration discussed with reference to FIG. 2 is commonly known and used in magnetic storage systems. However, several problems arise with this configuration because the read circuitry and the write circuitry are connected together at head contacts HD1 and HD2. Large voltage swings are produced during write mode operation at head contacts HD1 and HD2 to rapidly reverse current direction in magnetic head 32. These voltage swings can damage the connected read circuitry. Because magnetic head 32 is formed by an inductive coil, current in the head cannot change instantaneously. The voltage swings at head contacts HD1 and HD2 have a tendency to rise momentarily above their forcing voltage and create overshoots or voltage spikes. These voltage spikes are even greater in high-inductance heads, which are commonly used in circuits of this type. The large voltages produced across head contacts HD1 and HD2 and across the read differential transistor pair may exceed the emitter-base breakdown voltage of the read differential transistor pair and degrade or otherwise damage the transistors.

FIG. 2 illustrates an example of a typical voltage breakdown path 54. During write mode operation, read differential transistor pair Q5 and Q6 are inactive. At steady-state in one situation, transistors Q1 and Q4 are OFF while transistors Q2 and Q3 are ON. In this situation, current flows from right to left in FIG. 2 through transistor Q3, magnetic head 32 and transistor Q2. Current flow in magnetic head 32 is reversed by rapidly turning OFF transistors Q2 and Q3 and turning ON transistors Q1 and Q4. Because the current flowing in magnetic head 32 cannot change instantaneously, the voltage at head contact HD1 rises rapidly, being initiated by transistor Q1. The voltage across head contacts HD1 and HD2 is also connected across the base terminals of the read differential transistor pair Q5 and Q6.

If this voltage is large enough, it causes current flow in the unselected read pair through the base-emitter junction of transistor Q5 and the base-emitter junction of transistor Q6, as shown by voltage breakdown path 54. If the voltage at head contact HD1 exceeds the voltage at head contact HD2 by a diode voltage drop across the base-emitter junction of transistor Q5 plus the emitter-base breakdown voltage of transistor Q6, transistor Q6 will break down causing permanent damage. As a result, the gain of the read differential transistor pair may drop, adversely affecting sensitivity of the read circuitry.

A second problem that arises during write mode operation with the read/write preamplifier configuration shown in FIG. 2 is cross-talk between a selected magnetic head and unselected magnetic heads in storage systems having a plurality of read/write preamplifiers connected in parallel. In this configuration, the collectors of each read differential transistor pair are connected together in parallel for connection to read amplifier 24 (shown in FIG. 1). Only one magnetic head is selected at a time, all other heads are unselected by powering down its associated read and write circuitry to prevent reading or writing from the unselected heads.

Figure 3:
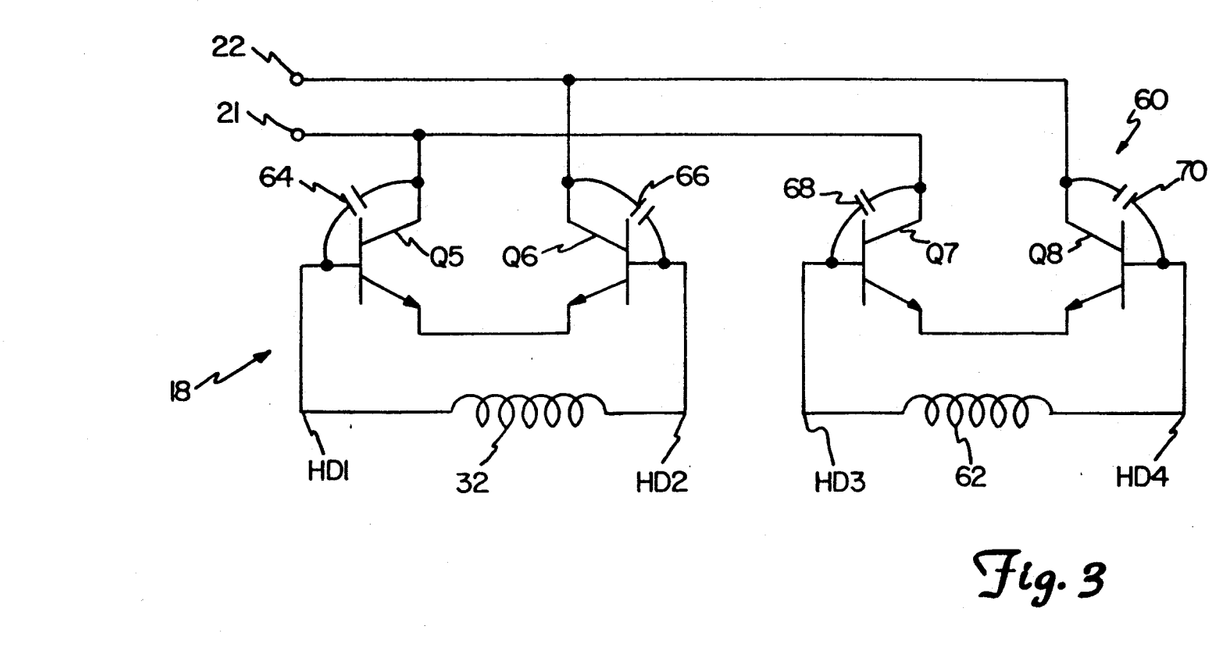
FIG. 3 is a schematic illustration of two read differential transistor pairs connected together in parallel with parasitic capacitances causing cross-talk.

FIG. 3 is a schematic illustration of a portion of read/write preamplifier 18 shown in FIG. 2 connected in parallel with another read/write preamplifier 60. Read/write preamplifier 30 includes read differential transistor pair Q5 and Q6 which are connected to magnetic head 32 at head contacts HD1 and HD2. The collectors of transistors Q5 and Q6 are connected to read output terminals 21 and 22. Read/write preamplifier 60 includes read differential transistor pair Q7 and Q8 which are connected to magnetic head 62 at head contacts HD3 and HD4. The collectors of transistors Q7 and Q8 are connected in parallel with the collectors of transistors Q5 and Q6 at read output terminals 21 and 22.

During write mode operation, all read differential transistor pairs are powered down by inactivating their associated read current sinks. Although all read differential transistor pairs are powered down, the voltage swings at head contacts HD1 and HD2 cause capacitive coupling between the read circuitry of a selected head and the read circuitry of unselected heads which causes cross-talk resulting in the performance of a write operation through the read differential transistor pairs of unselected magnetic heads.

The collector-base junctions of transistors Q5, Q6, Q7 and Q8 include intrinsic or parasitic capacitances, indicated by collector-base capacitances 64, 66, 68 and 70. If magnetic head 32, for example, is selected and is operating in write mode, the write circuitry associated with magnetic head 32 will create large and rapid voltage swings at head contacts HD1 and HD2. These voltage swings charge and discharge parasitic capacitances 64 and 66, thereby creating relatively large current flow in the read data output signals at read output terminals 21 and 22. The current flow in the read data output signals charges and discharges parasitic capacitances 68 and 70 generating a relatively large current flow in unselected magnetic head 62.

The current flow generated in unselected magnetic head 62 can create a magnetic field large enough to corrupt data stored on an adjacent magnetic disk. This effectively results in the performance of a write operation through the read differential transistor pair of an unselected read/write preamplifier.

Magnetic head swing clamp 10 shown in FIG. 1 prevents both emitter-base breakdown and cross-talk by clamping positive and negative voltage swings in the read data output signals at read output terminals 21 and 22. Positive voltage clamp 12 prevents emitter-base breakdown in the read differential transistor pair by clamping positive voltage swings at read output terminals 21 and 22 as a function of a first reference voltage level. Positive voltage clamp 12 includes PNP-type transistors Q9 and Q10. The emitters of transistors Q9 and Q10 are connected to read output terminals 21 and 22 respectively. The collectors of transistors Q9 and Q10 are connected together at a relatively negative voltage rail 72. In one embodiment, voltage rail 72 provides a voltage of approximately 5 volts. The bases of transistors Q9 and Q10 are connected together at reference voltage output terminal 74 of reference voltage generator 16. Reference voltage generator 16 biases the bases of transistors Q9 and Q10 at the first reference voltage level.

The magnitude of the first reference voltage level determines the voltage at which positive voltage clamp 12 clamps read output terminals 21 and 22. If the voltage at read output terminal 21 or 22 rises above the first reference voltage level by at least one diode drop (the emitter-base voltage drop of transistor Q9), transistor Q9 will turn ON and clamp the voltage at output terminal 21. Similarly, if the voltage at read output terminal 22 rises above the first reference voltage level by at least one diode drop (the base-emitter voltage drop of transistor Q10), transistor Q10 will turn ON and clamp the voltage at read output terminal 22. It should be understood that transistors Q9 and Q10, during write mode operation, are normally ON and conduct some current but turn ON much harder when the voltages at read output terminals 21 and 22 rise.

Figure 4:
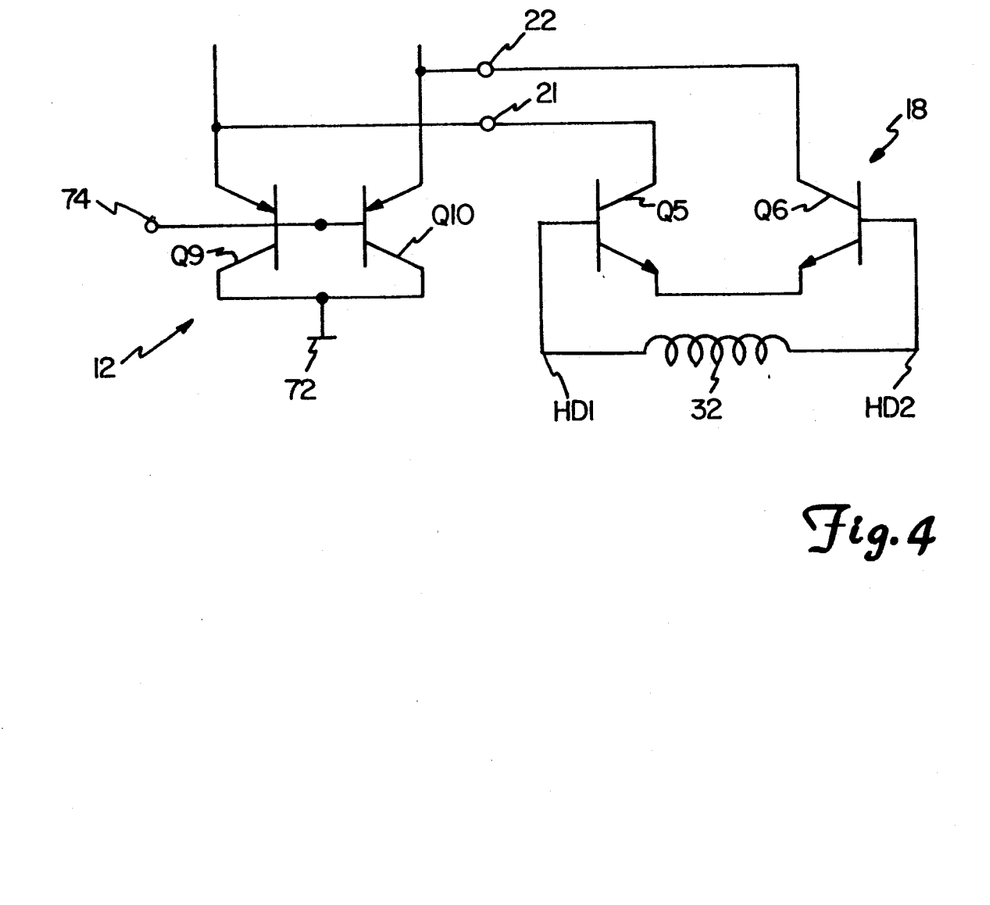
FIG. 4 is a schematic illustration of a portion of the magnetic head swing clamp shown in FIG. 1 connected to read output terminals of a read differential transistor pair.

FIG. 4 is a schematic illustration of positive voltage clamp 12 connected to the read differential transistor pair Q5 and Q6 of read/write preamplifier 18. If the voltage at head contact HD1 rises to a voltage approximately two diode drops above the first reference voltage level at reference voltage output terminal 74, the base-collector junction of transistor Q5 forward biases and PNP-type transistor Q9 turns ON to clamp the voltage level at read output terminal 21, thereby clamping the base voltage of transistor Q5 at head contact HD1.

The first reference voltage level may be selected such that the voltage across head contact terminals HD1 and HD2 never exceeds the emitter-base breakdown voltages of the read differential transistor pair Q5 and Q6. Only a single positive voltage clamp is needed in a magnetic storage system having a plurality of read/write preamplifier circuits because the collectors of all the read differential transistor pairs are connected together in parallel at read output terminals 21 and 22. Therefore, positive voltage clamp 12 provides a simplistic, inexpensive solution to the emitter-base breakdown effect in magnetic storage systems.

Referring back to FIG. 1, negative voltage clamp 14 clamps negative voltage swings in the read data output signals at read output terminals 21 and 22 caused by negative voltage swings at head contacts HD1 and HD2. Negative voltage clamp 14 includes NPN-type transistors Q11 and Q12. The emitters of transistors Q11 and Q12 are connected to read output terminals 21 and 22, respectively. The collectors of transistors Q11 and Q12 are connected together at the cathode of diode D1. The bases of transistors Q11 and Q12 are connected together at reference voltage output terminal 76 of reference voltage generator 16. Reference voltage generator 16 generates a second reference voltage level at reference voltage output terminal 76.

The magnitude of the second reference voltage level determines the voltage at which negative voltage clamp 14 clamps read output terminals 21 and 22. When the read data output signals at read output terminals 21 and 22 drop below the second reference voltage level by about one diode drop (the base-emitter voltage drops of transistors Q11 and Q12), the respective transistor Q11 or Q12 turns ON to clamp these voltages. It should be understood that during write mode operation, transistors Q11 and Q12 normally are ON and conduct some current but turn ON much harder when the voltages at read output terminals 21 and 22 drop.

The first and second reference voltage levels are selected such that positive and negative voltage clamps 12 and 14 provide a small voltage window within which the read data output signals at read output terminals 21 and 22 may swing during write mode operation. As discussed with reference to FIG. 3, positive and negative voltage swings at head contacts HD1 and HD2 produce relatively large currents at read output terminals 21 and 22 through parasitic collector-base capacitances 64 and 66. By limiting the voltage swings at read output terminals 21 and 22, the magnetic head swing clamp of the present invention prevents excess charge from coupling to unselected read/write preamplifiers. For example, clamping the voltage at the midpoint between the series connection of parasitic-capacitances 64 and 68 prevents excess charge from transferring from capacitance 64 to capacitance 68. Therefore, magnetic head swing clamp 10 also prevents cross-talk between preamplifiers connected in parallel.

Reference voltage generator 16 generates the first and second reference voltage levels at reference voltage output terminals 74 and 76 as a function of complementary mode signals received at input terminals 80 and 82. Reference voltage generator 16 may be operated in either the read mode or the write mode, depending upon the logic states of the complementary mode signals. During read mode operation, reference voltage generator 16 adjusts the first and second reference voltage levels to inactivate positive and negative voltage clamps 12 and 14. During write mode operation, reference voltage generator 16 adjusts the first and second reference voltage levels to activate positive and negative voltage clamps 12 and 14. During write mode operation, voltage bias input terminal 84 may be used to select or vary the first and second reference voltage levels generated at reference voltage output terminals 74 and 76, as discussed in greater detail below.

During write mode operation, the mode signals received at input terminal 80 are logic LOW and the mode signals received at input terminal 82 are logic HIGH. The logic LOW state at the base of transistor Q13 turns transistor Q13 OFF. With transistor Q13 OFF, transistor Q14 turns OFF causing the current mirror formed by transistors Q15 and Q16 to turn OFF.

The logic HIGH state at input terminal 82 causes transistors Q17 and Q18 to turn ON and the current mirror formed by transistors Q19 and Q20 to turn ON. Current sink 83 sinks current for the current mirror Q19 and Q20. Transistor Q20 pulls the base of transistor Q21 HIGH toward relatively positive voltage supply rail 90 until the base voltage of transistor Q21 reaches about one diode drop above the voltage bias applied to voltage bias level input terminal 84. At this point, voltage bias transistor Q22 turns ON and clamps the base voltage of transistor Q21.

Transistor Q21 turns ON and forward biases diode D2. With diode D2 forward biased and transistors Q21 and Q22 ON, the second reference voltage level at reference voltage output terminal 76 is clamped at approximately one diode drop below voltage bias level bias applied to voltage bias input terminal 84.

Bias resistors R1 and R2 bias transistor Q23 such that when transistor Q21 turns ON, transistor Q23 turns ON. In one embodiment, for example, the resistance values of resistors of R1 and R2 are selected such that the voltage drop from the collector to the emitter of transistor Q23 is approximately 1.5 diode drops (about 1.1 volts) when transistors Q21 and Q23 are ON. Therefore, with the second reference voltage level set at $V_{BIAS}$ − 1.0 diode drop, the first reference voltage level is set at $V_{BIAS}$ − 2.5 diode drops.

With the base of transistors Q11 and Q12 set at $V_{BIAS}$ − 1.0 diode drop, negative voltage clamp 14 clamps negative voltage swings at read output terminals 21 and 22 at $V_{BIAS}$ − 2.0 diode drops. With the base voltages of transistors Q9 and Q10 set at $V_{BIAS}$ − 2.5 diode drops, positive voltage clamp 12 clamps positive voltage swings at read output terminals 21 and 22 at about $V_{BIAS}$ − 1.5 diode drops. Positive and negative voltage clamps 12 and 14 therefore create a voltage swing window of about:

($V_{BIAS}$ − 1.5 diode drops) − ($V_{BIAS}$ − 2.0 diode drops) = 0.5 diode drops.

Voltage bias level $V_{BIAS}$ may be varied or adjusted as needed to match the bias level of the read data output signals during write mode operation. In one embodiment, voltage bias level $V_{BIAS}$ is set at approximately 9.3 volts and one diode drop is approximately equal to 0.7 volts. The first reference voltage level is set at approximately 9.3−2.5(0.7)=7.55 volts. The second reference voltage level is set at approximately 9.3−1.0(0.7)=8.6 volts. In this embodiment, the voltage swing window created by positive and negative voltage clamps 12 and 14 lies between about 7.9 volts and about 8.25 volts (i.e., 8.6−0.7=7.9 volts, 7.55+0.7=8.25 volts). The read data output signals may only vary by approximately 0.35 volts which is insufficient to generate capacitive coupling between selected and unselected magnetic heads.

During read mode operation, the mode signals received at input terminals 80 and 82 inactivate positive and negative voltage clamps 12 and 14. The mode signals received at input terminal 80 are logic HIGH and the mode signals received at input terminal 82 are logic LOW. The logic LOW at input terminal 82 turns off transistors Q17 and Q18 causing the current mirror formed by transistors Q19 and Q20 to turn OFF. The logic HIGH level at input terminal 80 turns transistor Q13 ON. Transistor Q13 pulls the emitters of transistors Q14 and Q22 and the base of transistor Q21 LOW until transistor Q14 turns ON and clamps the emitter of transistor Q3 at one diode drop below voltage supply rail 72. In one embodiment, voltage supply rail 72 is approximately 5.0 volts. Therefore, the emitter of transistor Q14 is clamped at approximately 4.3 volts (5 volts−0.7 volts).

The current mirror Q15 and Q16 turns ON and pulls the anode of diode D3 HIGH to forward bias diodes D3 and D4. With the cathode of diode D4 clamped at approximately 4.3 volts, the anode of diode D4 is clamped at approximately one diode drop above 4.3 volts (at 5.0 volts) and the anode of diode D3 is clamped at approximately one diode drop above 5.0 volts (at 5.7 volts). Transistor Q21 and Q23 turn OFF. The first reference voltage level is set to approximately 5.7 volts and the second reference voltage level is set to approximately 5.0 volts.

In a typical read/write preamplifier, such as read/write preamplifier 18 shown in FIG. 2, the voltage swings during read mode operation at read output terminals 21 and 22 are less than 1 millivolt. Therefore, if the read data output terminals 21 and 22 are biased between about 4.3 volts and about 6.4 volts, (i.e., 5.0−0.7=4.3 volts, 5.7+0.7=6.4 volts). The voltage window created by positive and negative voltage clamps 12 and 14 will be sufficiently large so that it will not interfere with the read data output signals. Voltage clamps 12 and 14 are effectively inactivated during read mode operation.

In conclusion, the magnetic head swing clamp of the present invention is configured for interconnection with the read data output signals of a read/write preamplifier. The magnetic head swing clamp may be operated in either the read mode or in the write mode. During read mode operation, the clamp is biased to prevent interference with the read data output signals. During write mode operation, the clamp is biased to clamp positive and negative voltage swings in the read data output signals caused by large and rapid voltage swings at the magnetic head contacts. The clamping action prevents degradation of the read differential transistor pair caused by excessive voltage swings and prevents cross-talk between magnetic heads caused by capacitive coupling between parallel read differential transistor pairs.

Although the present invention has been described with reference to preferred embodiments, workers skilled in the art will recognize that changes may be made in form and detail without departing from the spirit and scope of the invention.

What is claimed is:

1. A magnetic head swing clamped read/write preamplifier responsive to mode signals which drive the preamplifier between read mode operation and write mode operation the magnetic head swing clamped read/write preamplifier comprising:

a read differential transistor pair connected to an inductive magnetic head, each of the collectors of the transistors in the read differential transistor pair are connected to one of first and second read output terminals for providing first and second read output signals thereto;

a write circuit connected to the inductive magnetic head for providing a write current thereto;

a reference voltage generator comprising a first reference voltage output terminal, the reference voltage generator generating a first reference voltage level at the first reference voltage output terminal;

a relatively negative voltage supply rail; and a positive voltage clamp circuit electrically connected to the first reference voltage output terminal and between the relatively negative voltage supply rail and each of the first and second read output terminals for limiting positive going voltage swings in the first and second read output signals as a function of the first reference voltage level.

2. The magnetic head swing clamped read/write preamplifier of claim 1 wherein the reference voltage generator further comprises a mode input terminal suited to receive the mode signals for driving the generator between read mode operation and write mode operation as a function of the mode signals.

3. The magnetic head swing clamped read/write preamplifier of claim 2 wherein the reference voltage generator further comprises voltage biasing circuitry connected to the mode input terminal and to the first reference voltage output terminal for varying the first reference voltage level as a function of the mode signals.

4. The magnetic head swing clamped read/write preamplifier of claim 1 wherein the positive voltage clamp comprises:

a first transistor including first and second terminals forming a primary current flow path connected in series between the first read output terminal and the relatively negative voltage supply rail, and including a control terminal connected to the first reference voltage output terminal; and a second transistor including first and second terminals forming a primary current flow path connected in series between the second read output terminal and the relatively negative voltage supply rail, and including a control terminal connected to the first reference voltage output terminal.

5. The magnetic head swing clamped read/write preamplifier of claim 1 wherein:

the reference voltage generator further comprises a second reference voltage output terminal that provides a second reference voltage level; and the magnetic head swing clamped read/write preamplifier further comprises a negative voltage clamp electrically connected to the second reference voltage output terminal and to the first and second read output terminals for clamping negative voltage swings in the first and second read output signals as a function of the second reference voltage level.

6. The magnetic head swing clamped read/write preamplifier of claim 5 wherein the negative voltage clamp comprises:

a relatively positive voltage supply rail;

a first transistor including first and second terminals forming a primary current flow path connected in series between the first read output terminal and the relatively positive voltage supply rail, and including a control terminal connected to the second reference voltage output terminal; and a second transistor including first and second terminals forming a primary current flow path connected in series between the second read output terminal and the relatively positive voltage supply rail, and including a control terminal connected to the second reference voltage output terminal.

7. A magnetic head swing clamped read/write preamplifier system of the type responsive to mode signals which drive a read/write preamplifier between read mode operation and write mode operation, the magnetic head swing clamped read/write preamplifier system comprising:

a plurality of read/write preamplifiers with each of the plurality having a write circuit connected to an inductive magnetic head for providing a write current thereto and a read circuit having a read differential transistor pair connected to the inductive magnetic head, the transistors in the plurality of read differential transistor pairs having collectors which are connected together in parallel thereby providing first and second read output signals at first and second read output terminals;

a reference voltage generator comprising a first reference voltage output terminal, the reference voltage generator generating a first reference voltage level at the first reference voltage output terminal; and a negative voltage clamp circuit electrically connected to the first reference voltage output terminal and to each of the collectors of the read differential pair of the plurality for limiting negative going voltage swings in each of the first and second read output signals as a function of the first reference voltage level.

8. The magnetic head swing clamped read/write preamplifier system of claim 7 wherein the reference voltage generator further comprises a mode input terminal suited to receive the mode signals for driving the generator between read mode operation and write mode operation as a function of the mode signals.

9. The magnetic head swing clamped read/write preamplifier system of claim 8 wherein the reference voltage generator further comprises voltage biasing circuitry connected to the mode input terminal and to the first reference voltage output terminal for varying the first reference voltage level as a function of the mode signals.

10. The magnetic head swing clamped read/write preamplifier system of claim 7 wherein the negative voltage clamp comprises:

a relatively positive voltage supply rail;

a first transistor including first and second terminals forming a primary current flow path connected in series between the first read output terminal and the relatively positive voltage supply rail, and including a control terminal connected to the first reference voltage output terminal; and a second transistor including first and second terminals forming a primary current flow path connected in series between the second read output terminal and the relatively positive voltage supply rail, and including a control terminal connected to the first reference voltage output terminal.

11. The magnetic head swing clamped read/write preamplifier system of claim 7 wherein:

the reference voltage generator further comprises a second reference voltage output terminal that provides a second reference voltage level at the second reference voltage output terminal; and the magnetic head swing clamped read/write preamplifier system further comprises a positive voltage clamp electrically connected to the second reference voltage output terminal and to the first and second read output terminals for clamping positive voltage swings in the first and second read output signals as a function of the second reference voltage level.

12. The magnetic head swing clamped read/write preamplifier system of claim 11 wherein the positive voltage clamp comprises:
a relative negative voltage supply rail;
a first transistor including first and second terminals forming a primary current flow path connected in series between the first read output terminal and the relatively negative voltage supply rail, and including a control terminal connected to the second reference voltage output terminal; and
a second transistor including first and second terminals forming a primary current flow path connected in series between the second read output terminal and the relatively negative voltage supply rail, and including a control terminal connected to the second reference voltage output terminal.

13. A magnetic head swing clamped read/write preamplifier system responsive to mode signals which drive a read/write preamplifier between read mode operation and write mode operation and including a write current switching circuit and a read circuit connected to an inductive magnetic head, the magnetic head swing clamped read/write preamplifier system comprising:
a plurality of read/write preamplifiers with each of the read circuits having a differential transistor pair connected to an inductive magnetic head, the collectors of the transistors in the read differential transistor pair providing first and second read output signals at first and second read output terminals connected in parallel with the other read differential transistor pairs for connection to a read amplifier;
a reference voltage generator comprising first and second reference voltage output terminals, the reference voltage generator generating a first reference voltage level at the first reference voltage output terminal and a second reference voltage level at the second reference voltage output terminal;
a positive voltage clamp circuit electrically connected between the first reference voltage output terminal and each of the first and second read output terminals for limiting positive going voltage swings in the first and second read output signals as a function of the first reference voltage level; and
a negative voltage clamp circuit electrically connected between the second reference voltage output terminal and each of the first and second read output terminals for limiting negative going voltage swings in the first and second read output signals as a function of the second reference voltage level.

14. The magnetic head swing clamped read/write preamplifier system of claim 13 wherein the reference voltage generator further comprises a mode input terminal suited to receive the mode signals for driving the generator between read mode operation and write mode operation as a function of the mode signals.

15. The magnetic head swing clamped read/write preamplifier system of claim 14 wherein the reference voltage generator further comprises voltage biasing circuitry connected to the mode input terminal and to the first and second reference voltage output terminals for varying the first and second reference voltage levels as functions of the mode signals.

16. The magnetic head swing clamped read/write preamplifier system of claim 13 wherein the positive voltage clamp comprises:
a relatively negative voltage supply rail;
a first transistor including first and second terminals forming a primary current flow path connected in series between the first read output terminal and the relatively negative voltage supply rail, and including a control terminal connected to the first reference voltage output terminal; and
a second transistor including first and second terminals forming a primary current flow path connected in series between the second read output terminal and the relatively negative voltage supply rail, and including a control terminal connected to the first reference voltage output terminal.

17. The magnetic head swing clamped read/write preamplifier system of claim 13 wherein the negative voltage clamp comprises:
a relatively positive voltage supply rail;
a first transistor including first and second terminals forming a primary current flow path connected in series between the first read output terminal and the relatively positive voltage supply rail, and including a control terminal connected to the second reference voltage output terminal; and
a second transistor including first and second terminals forming a primary current flow path connected in series between the second read output terminal and the relatively positive voltage supply rail, and including a control terminal connected to the second reference voltage output terminal.

18. A clamped read/write preamplifier system suited for use with a device providing a read mode select signal for reading information from a magnetic media and a write mode select signal for writing information to the magnetic media, the clamped read/write preamplifier system comprising:
a plurality of inductive magnetic heads each of which having a pair of terminals electrically connected thereto;
a plurality of write circuits each of which being electrically connected to each of the pair of terminals of one of the plurality of inductive magnetic heads for providing a write current thereto in response to the write mode select signal;
a plurality of read preamplifier circuits each of which being electrically connected to each of the pair of terminals of one of the plurality of inductive magnetic heads and providing common read output signals for the plurality of the preamplifier circuits at a pair of read output terminals in response to the read mode select signal;
a reference voltage generator for providing a reference voltage level at a reference voltage output terminal;
a clamping circuit electrically connected to the reference voltage output terminal and between a voltage supply rail and at least one of the common read output terminals of the plurality of read preamplifier circuits for limiting voltage swings at the pair of read output terminals as a function of the reference voltage level; and coupling means for selectively coupling the clamping circuit to each of the pair of terminals of the plurality of inductive magnetic heads for clamping voltage swings as a function of the reference voltage level, with coupling of the clamping circuit being based on voltage swing magnitude at each of the pair of terminals for the plurality of inductive magnetic heads.

19. A magnetic head swing clamped read preamplifier configured for connection to an inductive magnetic head, the read preamplifier comprising:

a first transistor having a control terminal and a controlled terminal with the control terminal connected to the inductive magnetic head and with the controlled terminal providing a read output signal at a read output terminal;

a reference voltage generator for providing a reference voltage level at a reference voltage output terminal;

a voltage supply terminal; and a voltage clamp circuit connected to the reference voltage output terminal and between the controlled terminal and the voltage supply terminal for limiting voltage swings in the read output signal as a function of the reference voltage level.

20. The magnetic head swing clamped read amplifier of claim 19 wherein the voltage clamp circuit is a positive voltage clamp circuit for limiting positive going voltage swings in the read output signal.

21. The magnetic head swing clamped read amplifier of claim 19 wherein the voltage clamp circuit is a negative voltage clamp circuit for limiting negative going voltage swings in the read output signal.

* * * * *

UNITED STATES PATENT AND TRADEMARK OFFICE
CERTIFICATE OF CORRECTION

PATENT NO. : 5,257,146

DATED : October 26, 1993

INVENTOR(S) : JOHN J. PRICE, JR., CRAIG M. BRANNON

It is certified that error appears in the above-identified patent and that said Letters Patent is hereby corrected as shown below:

On the Title Page of the Patent, in the References Cited Section, under U.S. PATENT DOCUMENTS, insert the following:

| | | |
|---|---|---|
| 4,480,275 | 10/1984 | Fawkes..............360/46 |
| 4,510,459 | 4/1988 | Guisinger...........330/265 |
| 4,521,817 | 6/1985 | Sasamura et al......360/46 |
| 4,525,753 | 6/1985 | Shimekie et al......360/45 |
| 4,688,112 | 8/1987 | Shoji et al.........360/60 |
| 4,811,119 | 3/1989 | Kobayashi et al.....358/328 |
| 4,816,934 | 3/1989 | Tsuyuguchi..........360/62 |

Signed and Sealed this

Thirtieth Day of May, 1995

*Attest:*

BRUCE LEHMAN

*Attesting Officer*     *Commissioner of Patents and Trademarks*